US010636865B1

(12) United States Patent
Mao et al.

(10) Patent No.: US 10,636,865 B1
(45) Date of Patent: Apr. 28, 2020

(54) DISPLAY SUBSTRATE, METHOD OF MANUFACTURING THE SAME, DISPLAY PANEL, AND DISPLAY APPARATUS

(71) Applicants: Chengdu BOE Optoelectronics Technology Co., Ltd., Chengdu (CN); BOE Technology Group Co., Ltd., Beijing (CN)

(72) Inventors: Ming Mao, Beijing (CN); Pan Zhao, Beijing (CN); Li Song, Beijing (CN); Ge Wang, Beijing (CN); Zhiliang Jiang, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/410,060

(22) Filed: May 13, 2019

(30) Foreign Application Priority Data

Oct. 31, 2018 (CN) .................... 2018 2 1790160 U

(51) Int. Cl.
*H01L 51/52* (2006.01)
*H01L 27/32* (2006.01)
*H01L 51/56* (2006.01)
*G02F 1/1345* (2006.01)

(52) U.S. Cl.
CPC ...... *H01L 27/3276* (2013.01); *H01L 51/5237* (2013.01); *H01L 51/56* (2013.01); *G02F 1/1345* (2013.01); *G02F 1/13452* (2013.01); *H01L 2224/45686* (2013.01); *H01L 2224/47* (2013.01)

(58) Field of Classification Search
CPC ................ H01L 27/3276; H01L 24/44; H01L 2224/45686; H01L 2224/47; H01L 27/3297; G02F 1/1345; G02F 1/13452
See application file for complete search history.

(56) References Cited

U.S. PATENT DOCUMENTS

| 8,049,412 B2 * | 11/2011 | Kwak ................ H01L 27/3276 313/504 |
| 8,143,782 B2 * | 3/2012 | Kim ...................... H01L 51/524 313/504 |
| 8,159,132 B2 * | 4/2012 | Kodama ............ H01L 51/5246 313/504 |
| 9,178,175 B2 * | 11/2015 | Iijima ................. H01L 51/5246 |

(Continued)

*Primary Examiner* — Nicholas J Tobergte
(74) *Attorney, Agent, or Firm* — Westman, Champlin & Koehler, P.A.

(57) ABSTRACT

A display substrate, a method of manufacturing the same, a display panel, and a display apparatus are provided. In one embodiment, a display substrate includes: a base substrate; a plurality of lead wires and a barrier on the base substrate, the plurality of lead wires being separated from one another to form a concave between every two adjacent ones of the plurality of lead wires; and a cover layer covering over the plurality of lead wires and the barrier; wherein the plurality of lead wires are insulated from the barrier, the plurality of lead wires are insulated from the cover layer, the plurality of lead wires are between the base substrate and the cover layer, the barrier is between the plurality of lead wires and the cover layer, and the barrier is formed at least at the concave between at least two of the plurality of lead wires to block the concave.

14 Claims, 6 Drawing Sheets

(56) References Cited

U.S. PATENT DOCUMENTS

| | | | |
|---|---|---|---|
| 9,287,343 B2* | 3/2016 | Imai | H01L 27/3258 |
| 9,692,008 B2* | 6/2017 | Tanaka | H01L 51/5246 |
| 9,871,084 B2* | 1/2018 | Liao | H01L 27/323 |
| 10,008,694 B2* | 6/2018 | Tanaka | H01L 51/5246 |
| 10,276,830 B2* | 4/2019 | Kishimoto | H01L 51/5256 |
| 2007/0103063 A1* | 5/2007 | Kim | H01L 27/3244 |
| | | | 313/504 |
| 2011/0272714 A1* | 11/2011 | Lhee | H01L 27/3276 |
| | | | 257/88 |
| 2017/0141349 A1* | 5/2017 | Kwak | H01L 51/56 |
| 2017/0155088 A1* | 6/2017 | Kim | H01L 27/3248 |
| 2017/0278897 A1* | 9/2017 | Ao | G09G 3/3208 |

* cited by examiner providing the base substrate forming the plurality of lead wires on the base substrate, the plurality of lead wires being separated from one another to form a concave between every two adjacent ones of the plurality of lead wires forming the barrier on the base substrate, the barrier being formed at least at the concave between at least two of the plurality of lead wires to block the concave forming the cover layer by spraying a solution for preparing the cover layer on the plurality of lead wires and the barrier

FIG. 8

DISPLAY SUBSTRATE, METHOD OF MANUFACTURING THE SAME, DISPLAY PANEL, AND DISPLAY APPARATUS

CROSS-REFERENCE TO RELATED APPLICATION

This application claims the benefit of Chinese Patent Application No. 201821790160.0, filed with the State Intellectual Property Office of China on Oct. 31, 2018, the whole disclosure of which is incorporated herein by reference.

TECHNICAL FIELD

The present disclosure relates to a field of display technology, and in particular, to a display substrate, a method of manufacturing the same, a display panel, and a display apparatus.

BACKGROUND

With the development of technology, the display apparatus is more and more widely used. The display apparatus includes a display panel, and the display panel includes a display substrate.

SUMMARY

According to an aspect of embodiments of the present disclosure, there is provided a display substrate comprising:
a base substrate;
a plurality of lead wires and a barrier on the base substrate, the plurality of lead wires being separated from one another to form a concave between every two adjacent ones of the plurality of lead wires; and
a cover layer covering over the plurality of lead wires and the barrier;
wherein the plurality of lead wires are insulated from the barrier, the plurality of lead wires are insulated from the cover layer, the plurality of lead wires are between the base substrate and the cover layer, the barrier is between the plurality of lead wires and the cover layer, and the barrier is formed at least at the concave between at least two of the plurality of lead wires to block the concave.

In some embodiments, an orthographic projection of the barrier on the base substrate overlaps with an orthographic projection of the at least two of the plurality of lead wires on the base substrate.

In some embodiments, the display substrate comprises a plurality of said barriers, wherein an orthographic projection of each of the plurality of barriers on the base substrate overlaps with an orthographic projection of the at least two of the plurality of lead wires on the base substrate.

In some embodiments, the plurality of lead wires are divided into a plurality of lead wire groups arranged successively on the base substrate in a direction parallel to a plane where the base substrate is located, and correspondingly the plurality of barriers are divided into a plurality of barrier groups,
each barrier of each of the plurality of barrier groups is formed at least at the concave between at least two lead wires of one, corresponding to the each of the plurality of barrier groups, of the plurality of lead wire groups, and
an orthographic projection of each barrier of each of the plurality of barrier groups on the base substrate overlaps with an orthographic projection of at least two lead wires of one, corresponding to the each of the plurality of barrier groups, of the plurality of lead wire groups on the base substrate.

In some embodiments, an orthographic projection of each of the plurality of lead wires on the base substrate overlaps with an orthographic projection of at least one of the barriers on the base substrate.

In some embodiments, a height of the barrier on the base substrate is greater than or equal to a height of each of the plurality of lead wires on the base substrate.

In some embodiments, the barrier is in a strip shape, an orthographic projection of the barrier on the base substrate intersects with an orthographic projection of one, corresponding to the barrier, of the plurality of lead wires on the base substrate, and the one, corresponding to the barrier, of the plurality of lead wires is a lead wire of which the orthographic projection on the base substrate overlaps with the orthographic projection of the barrier on the base substrate.

In some embodiments, the orthographic projection of the barrier on the base substrate has a straight-linear shape, a curvilinear shape or a zigzag shape.

In some embodiments, the display substrate can further comprise: a ring-shaped wall structure between the plurality of lead wires and the cover layer;
wherein the base substrate comprises a display region and a non-display region surrounding the display region, both the plurality of lead wires and the barrier are within the non-display region, and both the display region and the barrier of the base substrate are surrounded by the ring-shaped wall structure.

In some embodiments, the ring-shaped wall structure further comprises a first ring-shaped wall substructure and a second ring-shaped wall substructure surrounding the first ring-shaped wall substructure, and both the display region and the barrier of the base substrate are surrounded by the first ring-shaped wall substructure.

In some embodiments, the display substrate comprises an OLED display substrate formed with a pixel circuit, the pixel circuit comprises a gate electrode, a power terminal, a gate electrode signal line connected to the gate electrode, and a power terminal signal line connected to the power terminal, and the plurality of lead wires comprise a gate electrode lead wire connected to the gate electrode signal line and a power terminal lead wire connected to the power terminal signal line.

In some embodiments, the display substrate comprises a flexible display substrate.

In some embodiments, the cover layer comprises a package layer.

According to another aspect of embodiments of the present disclosure, there is provided a method of manufacturing the display substrate of any one of the abovementioned embodiments, and the method comprises:
providing the base substrate;
forming the plurality of lead wires on the base substrate, the plurality of lead wires being separated from one another to form a concave between every two adjacent ones of the plurality of lead wires;
forming the barrier on the base substrate, the barrier being formed at least at the concave between at least two of the plurality of lead wires to block the concave; and
forming the cover layer by spraying a solution for preparing the cover layer on the plurality of lead wires and the barrier.

According to yet another aspect of embodiments of the present disclosure, there is provided a display panel comprising: the display substrate of any one of the abovementioned embodiments.

According to still another aspect of embodiments of the present disclosure, there is provided a display apparatus comprising: the display panel of any one of the abovementioned embodiments.

It should be understood that, the above general description and the following detailed description are merely exemplary and are not intended to limit the present disclosure.

BRIEF DESCRIPTION OF THE DRAWINGS

In order to describe embodiments of the present disclosure more clearly, accompanying drawings required for describing the embodiments will be simply explained as below. Apparently, the accompanying drawings for the following description are only some embodiments of the present disclosure. Those skilled in the art also could derive other accompanying drawings from these accompanying drawings without making a creative work.

FIG. 8 is a flow diagram of a method of manufacturing a display substrate according to an embodiment of the present disclosure.

The accompanying drawings herein are incorporated in and constitute a part of the description, illustrate the embodiments of the present disclosure, and are used together with the description to explain the principles and spirit of the present disclosure.

DETAILED DESCRIPTION

In order to make the objects, technical solutions and advantages of the present disclosure more apparent, the present disclosure will be further described in detail below with reference to the accompanying drawings. Apparently, the described embodiments are some of the embodiments of the present disclosure rather than all of the embodiments of the present disclosure. All other embodiments derived by those skilled in the art based on the embodiments of the present disclosure without making a creative work shall fall within the protection scope of the present disclosure.

A display substrate includes a base substrate, lead wires and a cover layer. The base substrate includes a display region and a non-display region, the lead wires are within the non-display region and are configured to connect electronic devices in the display region with a circuit board outside the display substrate, and the cover layer covers the display region and the lead wires.

In the related art, in the process of preparing a display substrate, the lead wires are formed on a base substrate, and then a solution for preparing a cover layer is sprayed on the base substrate on which the lead wires are formed. The cover layer is formed after the solution is dried.

However, since the display substrate includes a plurality of lead wires and concaves are formed between these lead wires. During the spraying of the solution for preparing the cover layer, a portion of the solution may flow out of the base substrate along the concaves between these lead wires, causing leakage of the solution, thereby resulting in a poor coverage effect of the cover layer formed after the solution is dried.

According to embodiments of the present disclosure, there is provided a display substrate. In the process of preparing the display substrate, leakage of the solution is less when a solution for preparing a cover layer is sprayed on a base substrate, thereby achieving a better coverage effect of the cover layer formed after the solution is dried.

Figure 1:
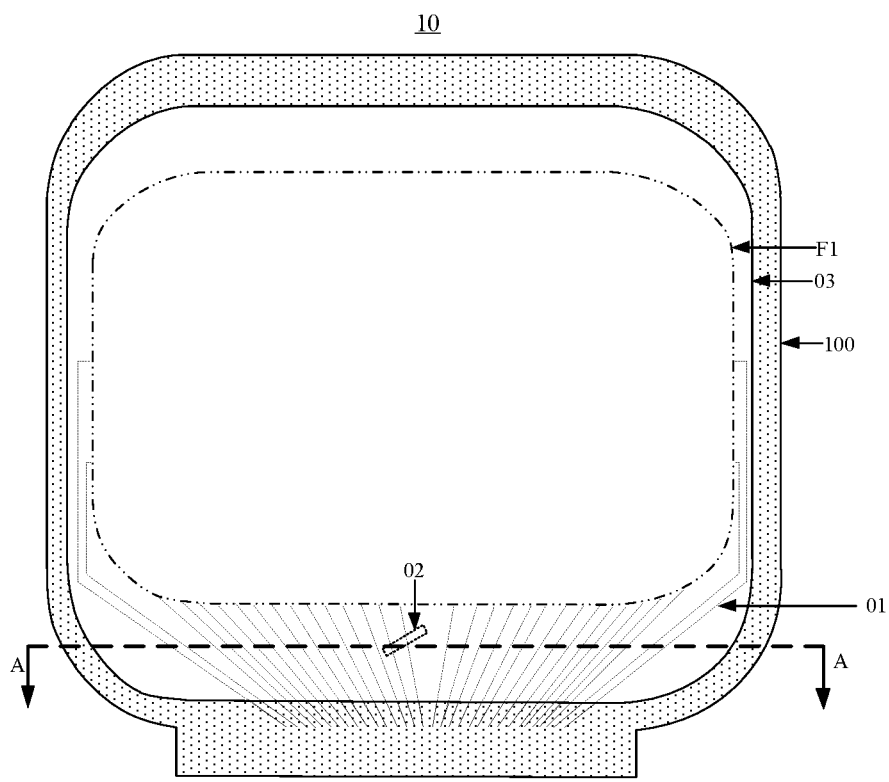
FIG. 1 is a schematic view showing a structure of a display substrate according to an embodiment of the present disclosure.
Figure 2:
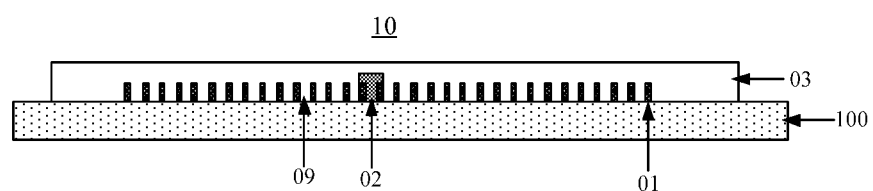
FIG. 2 is a sectional schematic view taken along a line A-A of FIG. 1.

FIG. 1 is a schematic view showing a structure of a display substrate according to an embodiment of the present disclosure, and FIG. 2 is a sectional schematic view taken along a line A-A of FIG. 1. It should be noted that, FIG. 1 shows a top view of the display substrate. Referring to FIG. 1 and FIG. 2, the display substrate 10 can include: a base substrate 100, a plurality of lead wires 01 and a barrier 02 on the base substrate 100, and a cover layer 03. The plurality of lead wires 01 are separated from one another to form a concave 09 between every two adjacent ones of the plurality of lead wires 01. The cover layer 03 covers over the plurality of lead wires 01 and the barrier 02.

The plurality of lead wires 01 are insulated from the barrier 02, and the plurality of lead wires 01 are insulated from the cover layer 03. The plurality of lead wires 01 are between the base substrate 100 and the cover layer 03, the barrier 02 is between the plurality of lead wires 01 and the cover layer 03, and the barrier 02 is formed at least at the concave 09 between at least two of the plurality of lead wires 01 to block the concave 09.

Moreover, an orthographic projection of the barrier 02 on the base substrate 100 overlaps with an orthographic projection of the at least two of the plurality of lead wires 01 on the base substrate 100.

It should be noted that, FIG. 1 shows an embodiment in which the display substrate 10 includes only one barrier 02. In some embodiments, the display substrate 10 can include other numbers (such as three) of the barriers 102. The number of the barriers can be set according to actual requirements, and it is not limited according to embodiments of the present disclosure. Moreover, FIG. 1 shows an embodiment in which the barrier 02 is formed at one concave 09 between two lead wires 01. In some embodiments, the barrier 02 may be formed over other numbers (such as two) of the concaves 09 between other numbers (such as three) of the lead wires 01. The numbers of the concaves and the lead wires over which one barrier is formed can be set according to actual requirements, and they are not limited according to embodiments of the present disclosure. In addition, FIG. 1 shows an embodiment in which an orthographic projection of the barrier 02 on the base substrate 100 overlaps with an orthographic projection of two lead wires 01 on the base substrate 100. In some embodiments, the orthographic projection of the barrier 02 on the base substrate 100 may overlap with an orthographic projection of other numbers (such as three) of the lead wires 01 on the base substrate 100. The number of the lead wires of which the orthographic projection on the base substrate 100 overlaps with the orthographic projection of one barrier on the base substrate can be set according to actual requirements, and it is not limited according to embodiments of the present disclosure.

Accordingly, in the display substrate according to the embodiments of the present disclosure, the barrier is located between the plurality of lead wires and the cover layer, and the barrier is formed at least at the concave between at least two of the plurality of the lead wires to block the concave. Therefore, in the process of preparing the display substrate, when the solution for preparing the cover layer is sprayed on the base substrate where the plurality of lead wires and the barrier are formed, the barrier can block the solution from flowing out of the base substrate along the concave formed between at least two lead wires, thereby reducing the amount of leakage of the solution and improving the coverage effect of the cover layer formed after the solution is dried.

Continuing with FIG. 1 and FIG. 2, the display substrate 10 may be an organic light-emitting diode (OLED) display substrate, the cover layer 03 may be a package layer, and the package layer may be used for packaging the display region and a portion of the non-display region of the base substrate 100.

The display substrate 10 may further include a display structure F1, and an area where the display structure F1 is located is the display region of the base substrate 100. The display structure F1 may include a plurality of pixel units and signal lines connecting to the pixel units. The display structure F1 may be located between the base substrate 100 and the cover layer 03, and the plurality of lead wires 01 are configured to connect the electronic devices (such as thin film transistors or electrodes in the pixel units) in the display region with a circuit board outside the display substrate.

Figure 3:
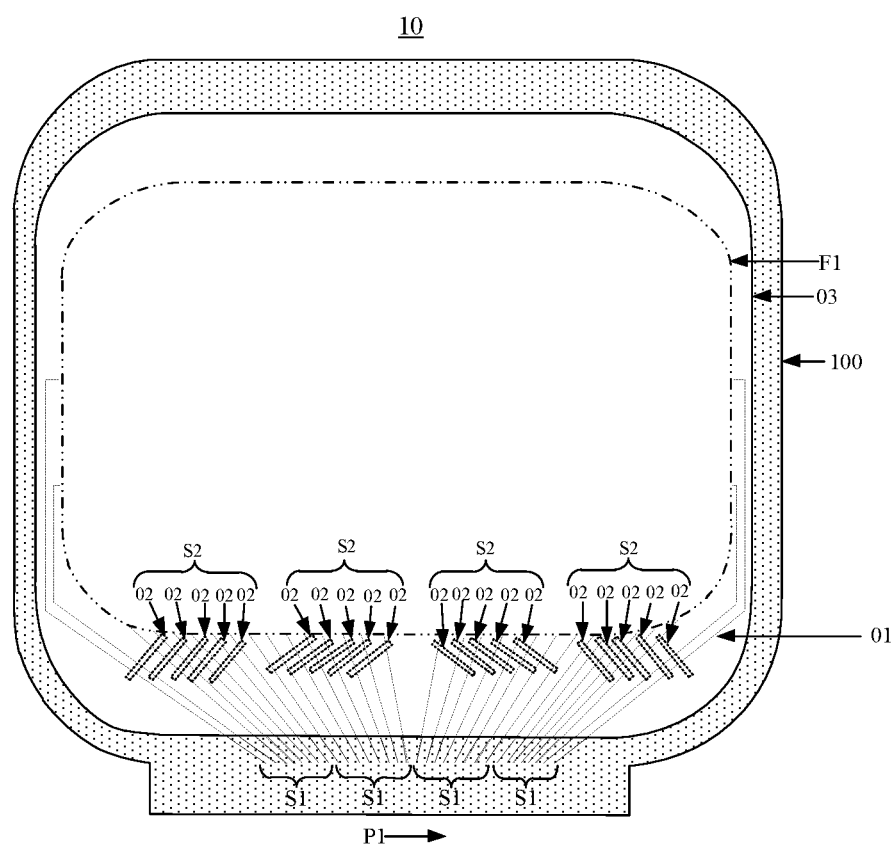
FIG. 3 is a schematic view showing a structure of a display substrate according to another embodiment of the present disclosure.

FIG. 3 is a schematic view showing a structure of a display substrate according to another embodiment of the present disclosure (, and FIG. 3 is also a top view of the display substrate). Referring to FIG. 3, the display substrate 10 may include a plurality of barriers 02. The plurality of barriers 02 are respectively formed at the concaves between different lead wires 01, and an orthographic projection of each of the plurality of barriers 02 on the base substrate 100 overlaps with an orthographic projection of at least two of the plurality of lead wires 01 on the base substrate 100. In this way, in the process of preparing the display substrate 10, when the solution for preparing the cover layer is sprayed on the base substrate on which the plurality of lead wires and the plurality of barriers are formed, the plurality of barriers 02 can further block the solution from flowing out of the base substrate 100, further reducing the amount of leakage of the solution.

In some embodiments, the plurality of lead wires 01 may be divided into a plurality of lead wire groups S1 arranged successively on the base substrate 100 in a direction P1 parallel to a plane where the base substrate 100 is located, the plurality of barriers 02 are divided into a plurality of barrier groups S2, and the plurality of lead wire groups S1 are in one-to-one correspondence with the plurality of barrier groups S2. Each barrier 02 of each of the plurality of barrier groups S2 is formed at least at the concave between at least two lead wires 01 of a corresponding one of the plurality of lead wire groups S1, and an orthographic projection of the each barrier 02 of each of the plurality of barrier groups S2 on the base substrate 100 overlaps with an orthographic projection of at least two lead wires 01 of a corresponding one of the plurality of lead wire groups S1 on the base substrate 100. In this way, in the process of preparing the display substrate 10, when the solution for preparing the cover layer is sprayed on the base substrate on which the plurality of lead wire groups and the plurality of barrier groups are formed, since the plurality of barrier groups are located respectively in a plurality of areas of the base substrate, the solution in the plurality of areas can be blocked, so that provision of the plurality of barrier groups causes a larger block range, further reducing the amount of leakage of the solution.

It should be noted that, in the embodiment shown in FIG. 3, the plurality of lead wires 01 are divided into four lead wire groups S1, and the plurality of barriers 02 are divided into four barrier groups S2, and each of the lead wire groups S1 includes eight lead wires 01, and each of the barrier groups S2 includes five barrier 02. In some embodiments, the plurality of lead wires 01 can also be divided into other groups (such as five groups) S1 of lead wires, and the plurality of barriers 02 can also be divided into other groups (such as five groups) S2 of barriers 02, each of the lead wire groups S1 may also include other number (such as ten) of lead wires 01, and each of the barrier groups S2 may also include other number (such as six) of barriers 02. According to the embodiments of the present disclosure, the number of the lead wires in different lead wire groups may be the same or different, and the number of the barriers in different barrier groups may be the same or different, and they are not limited according to the embodiments of the present disclosure.

In some embodiments, an orthographic projection of each of the plurality of lead wires 01 on the base substrate 100 overlaps with an orthographic projection of at least one of the barriers 02 on the base substrate 100. That is, a barrier is formed at the concave between every two lead wires 01 on the base substrate 100. In addition, in some embodiments, a height of the barrier 02 on the base substrate 100 is greater than or equal to a height of each of the plurality of lead wires 01 on the base substrate 100. In the illustrated embodiments, the height of the barrier 02 on the base substrate 100 is greater than the height of each of the plurality of lead wires 01 on the base substrate 100. In this way, in the process of preparing the display substrate, when the solution for preparing the cover layer is sprayed on the base substrate on which the plurality of lead wires and the plurality of barriers are formed, a portion of the solution flowing in a concave which is formed between each lead wire and at least one lead wire adjacent to the each lead wire can be blocked, further reducing the amount of leakage of the solution.

In some embodiments, the barrier 02 may be in a strip shape, an orthographic projection of the barrier 02 on the base substrate 100 intersects with an orthographic projection of one, corresponding to the barrier 02, of the plurality of lead wires 01 on the base substrate 100, and the one, corresponding to the barrier 02, of the plurality of lead wires 01 is a lead wire of which the orthographic projection on the base substrate 100 overlaps with the orthographic projection of the barrier 02 on the base substrate 100. In this way, in the process of preparing the display substrate, after the solution for preparing the cover layer is sprayed on the base substrate, the barrier can block the flow of the solution when the solution flows along the concave which is formed between at least two lead wires corresponding to the barrier, to reduce the flow rate of the solution. Moreover, since the barrier has a larger block range for the solution, and the solution takes a longer time to flow along the barrier, so that the barrier can greatly reduce the flow rate of the solution, enabling the flow of the solution to stop at the edge of the base substrate or enabling some of the solution to have dried out before flowing out of the base substrate, thereby reducing the amount of leakage of the solution.

In some embodiments, the orthographic projection of the barrier 102 on the base substrate 100 can has a straight-linear shape. In some embodiments, the orthographic projection of the barrier 102 on the base substrate 100 can be substantially perpendicular to the orthographic projection of at least one lead wire 101 corresponding to the barrier 102 on the base substrate 100. In this case, the block range of the barrier substantially perpendicular to the at least one lead wire is further increased, and the time taken for the solution to flow along the barrier is further lengthened, further reducing the amount of leakage of the solution.

Figure 4:
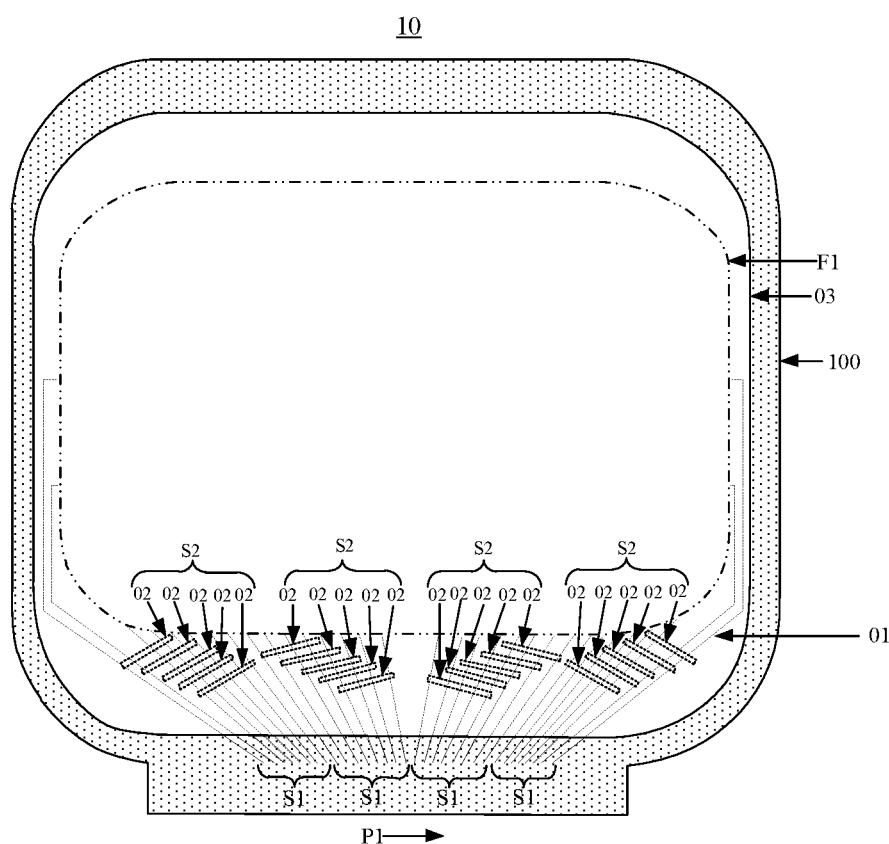
FIG. 4 is a schematic view showing a structure of a display substrate according to a further embodiment of the present disclosure.

FIG. 4 is a schematic view showing a structure of a display substrate according to a further embodiment of the present disclosure. Referring to FIG. 4, regarding the arrangement of the plurality of lead wire groups S1 and the plurality of barrier groups S2 of the display substrate 10, an arrangement direction of barriers of each of the plurality of barrier groups S2 may be different from an arrangement direction of lead wires of one of the plurality of lead wire groups S1 corresponding to the each of the plurality of barrier groups S2. When the solution for preparing the cover layer flows along the concaves formed by the one lead wire group corresponding to the each of the plurality of barrier groups S2, these barriers in the each of the plurality of barrier groups S2 sequentially block flow of the solution, so that the time taken for the solution to flow along the barriers is further lengthened, further reducing the amount of leakage of the solution.

In some embodiments, the arrangement direction of barriers of each of the plurality of barrier groups S2 may be perpendicular to the arrangement direction of lead wires of one of the plurality of lead wire groups S1 corresponding to the each of the plurality of barrier groups S2. In this case, the block range of the each of the plurality of barrier groups S2 is further increased, and the time taken for the solution to flow along the each of the plurality of barrier groups S2 is further lengthened, further reducing the amount of leakage of the solution.

Figure 5:
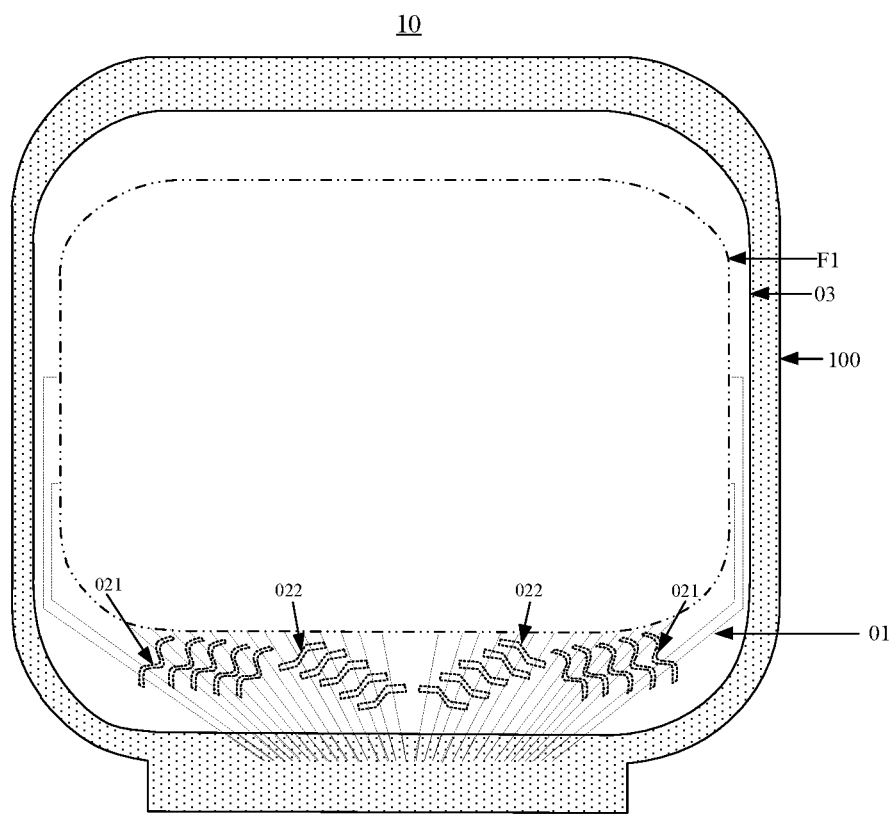
FIG. 5 is a schematic view showing a structure of a display substrate according to a yet further embodiment of the present disclosure.

In some embodiments, the orthographic projection of the barrier on the base substrate 100 can also have a non-linear shape. For example, FIG. 5 is a schematic view showing a structure of a display substrate according to a yet further embodiment of the present disclosure. As shown in FIG. 5, a plurality of barriers in the display substrate 10 may have the following configuration, that is, an orthographic projection of a barrier 021 on the base substrate 100 has a curvilinear shape. When the solution for preparing the cover layer flows out of the base substrate, the flow path of the solution along the curved barrier is tortuous, so that the time taken for the solution to flow along the barrier further lengthens, further reducing the amount of leakage of the solution.

In some embodiments, continuing with FIG. 5, the plurality of barriers may adopt the following configuration, that is, the orthographic projection of the barrier 022 on the base substrate 100 has a zigzag shape. It should be noted that, FIG. 5 shows an embodiment in which the plurality of barriers include barriers 021 of which the orthographic projections on the base substrate 100 has a curvilinear shape and barriers 022 of which the orthographic projections on the base substrate 100 has a zigzag shape. In some embodiments, the orthographic projection of each of the plurality of barriers on the base substrate 100 has a curvilinear shape, or, the orthographic projection of each of the plurality of barriers on the base substrate 100 has a zigzag shape, or else, the orthographic projection of the barrier on the base substrate 100 may have other shape. It is not limited according to embodiments of the present disclosure.

Figure 6:
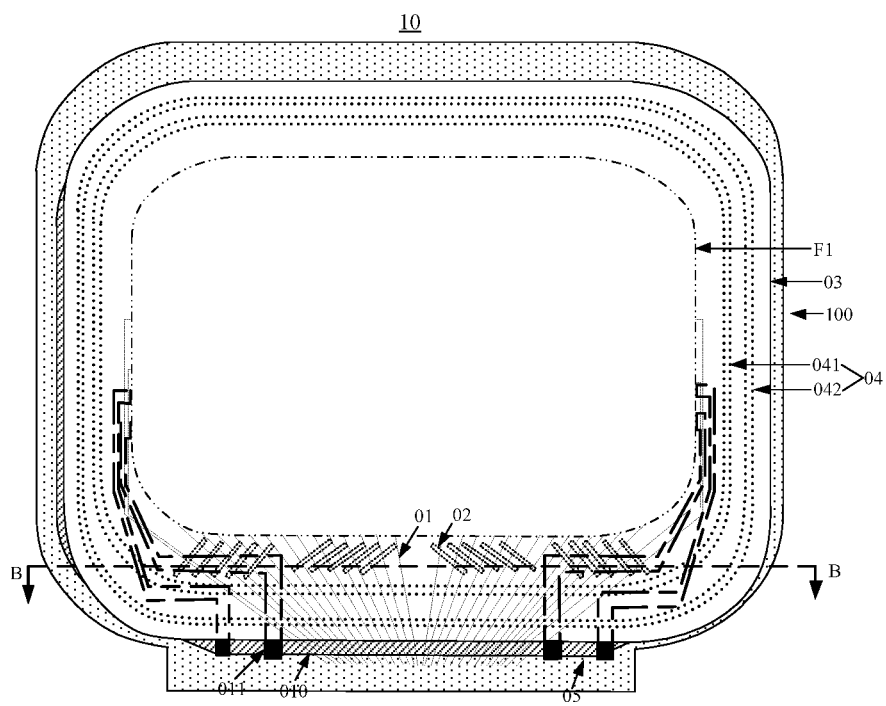
FIG. 6 is a schematic view showing a structure of a display substrate according to a still further embodiment of the present disclosure.
Figure 7:
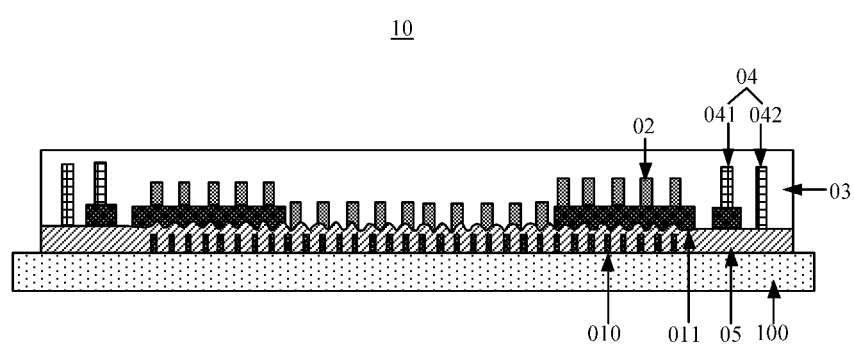
FIG. 7 is a sectional schematic view taken along a line B-B of FIG. 6.

FIG. 6 is a schematic view showing a structure of a display substrate according to a still further embodiment of the present disclosure, and FIG. 7 is a sectional schematic view taken along a line B-B of FIG. 6. Referring to FIG. 6 and FIG. 7, the display substrate 10 may further include: a ring-shaped wall structure 04 between the plurality of lead wires 01 and the cover layer 03. The base substrate includes a display region and a non-display region (namely a region of the base substrate which is outside an area where the display structure F1 is located) surrounding the display region, both the plurality of lead wires 01 and the barrier 02 are within the non-display region of the base substrate 100, and both the display region (namely the area where the display structure F1 is located) of the base substrate 100 and the barrier 02 are surrounded by the ring-shaped wall structure 04. When the solution for preparing the cover layer flows out of the base substrate, the ring-shaped wall structure 04 can retain a portion of the solution within the annular region surrounded by the ring-shaped wall structure, thereby reducing the amount of leakage of the solution.

In some embodiments, the ring-shaped wall structure 04 includes a first ring-shaped wall substructure 041 and a second ring-shaped wall substructure 042 surrounding the first ring-shaped wall substructure 041, and both the display region of the base substrate 100 and the barrier 02 are surrounded by the first ring-shaped wall substructure 041. After the solution for preparing the cover layer flows out of an annular region surrounded by the first ring-shaped wall substructure, the second ring-shaped wall substructure can further block the solution, so that more solution is retained within the annular region surrounded by the ring-shaped wall structure, further reducing the amount of leakage of the solution.

In some embodiments, provided that the display substrate is an OLED display substrate, the pixel unit in the display structure of the display substrate may include: an OLED and a pixel circuit for driving the OLED, the pixel circuit has a gate electrode and a power terminal. The signal line in the display structure of the display substrate may include: a gate electrode signal line connected to the gate electrode, and a power terminal signal line connected to the power terminal. Continuing with FIG. 6 and FIG. 7, the plurality of lead wires may include a plurality of gate electrode lead wires 010 and a plurality of power terminal lead wires 011. The gate electrode lead wire 010 is used to connect to the gate electrode signal line, and the power terminal lead wire 011 is used to connect to the power terminal signal line. The plurality of gate electrode lead wires 010 may be located in the same layer, and the plurality of power terminal lead wires 011 may be located in the same layer. Moreover, the display substrate 10 may further include: a planarization layer 05 between the plurality of gate electrode lead wires 010 and the plurality of power terminal lead wires 011, and the material of the planarization layer 05 may be an insulating material.

In some embodiments, the display substrate 10 can be a flexible display substrate.

In some embodiments, the material of barrier 02 can be the same as that of planarization layer 05.

It should be noted that, FIGS. 1-7 show these embodiments in which the base substrate 100 of the display substrate 10 has a shape having rounded corners. In some embodiments, the base substrate 100 may have a shape having no rounded corners (for example, a rectangular shape), and it is not limited according to embodiments of the present disclosure.

According to embodiments of the present disclosure, there is further disclosed a method of manufacturing the display substrate according to any one of the abovementioned embodiments. Referring to FIG. 8, the method includes: providing the base substrate; forming the plurality of lead wires on the base substrate, the plurality of lead wires being separated from one another to form a concave between every two adjacent ones of the plurality of lead wires; forming the barrier on the base substrate, the barrier being formed at least at the concave between at least two of the plurality of lead wires to block the concave; and forming the cover layer by spraying a solution for preparing the cover layer on the plurality of lead wires and the barrier.

More specifically, according to exemplary embodiments, in the process of preparing the display substrate, the base substrate may be provided first, then the display structure, the gate electrode lead wire, the planarization layer, the power terminal lead wire, and the ring-shaped wall structure are prepared on the base substrate; after that, the barrier is formed on the plurality of lead wires (including the gate electrode lead wire and the power terminal lead wire) between the display region of the base substrate and the ring-shaped wall structure; finally, the solution for preparing the cover layer is sprayed on the display region of the base substrate and a portion of the non-display region. The cover layer can be formed after the solution is dried, to obtain the display substrate.

It should be noted that, in the process of preparing the display substrate on the base substrate, the gate electrode and the gate electrode signal line in the display structure may be formed in the same layer as the gate electrode lead wire; the power terminal (also referred to as Vss or Vdd) and the power terminal signal line in the display structure may be formed in the same layer as the power terminal lead wire.

Accordingly, in the display substrate according to the embodiments of the present disclosure, the barrier is located between the plurality of lead wires and the cover layer, and the barrier is formed at least at the concave between at least two of the plurality of the lead wires to block the concave. Therefore, in the process of preparing the display substrate, when the solution for preparing the cover layer is sprayed on the base substrate where the plurality of lead wires and the barrier are formed, the barrier can block a portion of the solution from flowing out of the base substrate along the concave formed between at least two lead wires, thereby reducing the amount of leakage of the solution and improving the coverage effect of the cover layer formed after the solution is dried.

According to embodiments of the present disclosure, there is also provided a display panel including the display substrate according to any one of the above embodiments. In some embodiments, the display panel may be a flexible display panel. In some embodiments, the display panel may be an OLED display panel.

According to embodiments of the present disclosure, there is further provided a display apparatus including the display panel according to any one of the above embodiments. For example, the display apparatus can be any product or component having a display function, such as electronic paper, mobile phone, tablet computer, television, display, notebook computer, digital photo frame, navigator, wearable display device, and the like.

Although some exemplary embodiments of the present disclosure have been shown and described above, it would be appreciated by a person skilled in the art that many modifications or changes may be made therein without departing from the principle and spirit of the present disclosure, the scope of which is defined in the appended claims and their equivalents.

What is claimed is:

1. A display substrate comprising:
a base substrate;
a plurality of lead wires and a plurality of barriers on the base substrate, the plurality of lead wires being separated from one another to form a concave between every two adjacent ones of the plurality of lead wires; and
a cover layer covering over the plurality of lead wires and the plurality of barriers;
wherein the plurality of lead wires are insulated from the plurality of barriers, the plurality of lead wires are insulated from the cover layer, the plurality of lead wires are between the base substrate and the cover layer, the plurality of barriers are between the plurality of lead wires and the cover layer, and each of the plurality of barriers is formed at least at the concave between at least two of the plurality of lead wires to block the concave;
wherein an orthographic projection of each of the plurality of barriers on the base substrate overlaps with an orthographic projection of the at least two of the plurality of lead wires on the base substrate.

2. The display substrate of claim 1, wherein the plurality of lead wires are divided into a plurality of lead wire groups arranged successively on the base substrate in a direction parallel to a plane where the base substrate is located, and correspondingly the plurality of barriers are divided into a plurality of barrier groups,
each barrier of each of the plurality of barrier groups is formed at least at the concave between at least two lead wires of one, corresponding to the each of the plurality of barrier groups, of the plurality of lead wire groups, and
an orthographic projection of each barrier of each of the plurality of barrier groups on the base substrate overlaps with an orthographic projection of at least two lead wires of one, corresponding to the each of the plurality of barrier groups, of the plurality of lead wire groups on the base substrate.

3. The display substrate of claim 1, wherein an orthographic projection of each of the plurality of lead wires on the base substrate overlaps with an orthographic projection of at least one of the barriers on the base substrate.

4. The display substrate of claim 1, wherein a height of the barrier on the base substrate is greater than or equal to a height of each of the plurality of lead wires on the base substrate.

5. The display substrate of claim 1, wherein the barrier is in a strip shape, an orthographic projection of the barrier on the base substrate intersects with an orthographic projection of one, corresponding to the barrier, of the plurality of lead wires on the base substrate, and the one, corresponding to the barrier, of the plurality of lead wires is a lead wire of which the orthographic projection on the base substrate overlaps with the orthographic projection of the barrier on the base substrate.

6. The display substrate of claim 5, wherein the orthographic projection of the barrier on the base substrate has a straight-linear shape, a curvilinear shape or a zigzag shape.

7. The display substrate of claim 1, further comprising: a ring-shaped wall structure between the plurality of lead wires and the cover layer;
  wherein the base substrate comprises a display region and a non-display region surrounding the display region, both the plurality of lead wires and the barrier are within the non-display region, and both the display region and the barrier of the base substrate are surrounded by the ring-shaped wall structure.

8. The display substrate of claim 7, wherein the ring-shaped wall structure comprises a first ring-shaped wall substructure and a second ring-shaped wall substructure surrounding the first ring-shaped wall substructure, and both the display region and the barrier of the base substrate are surrounded by the first ring-shaped wall substructure.

9. The display substrate of claim 1, wherein the display substrate comprises an OLED display substrate formed with a pixel circuit, the pixel circuit comprises a gate electrode, a power terminal, a gate electrode signal line connected to the gate electrode, and a power terminal signal line connected to the power terminal, and the plurality of lead wires comprise a gate electrode lead wire connected to the gate electrode signal line and a power terminal lead wire connected to the power terminal signal line.

10. The display substrate of claim 1, wherein the display substrate comprises a flexible display substrate.

11. The display substrate of claim 1, wherein the cover layer comprises a package layer.

12. A method of manufacturing the display substrate of claim 1, the method comprising:
  providing the base substrate;
  forming the plurality of lead wires on the base substrate, the plurality of lead wires being separated from one another to form a concave between every two adjacent ones of the plurality of lead wires;
  forming the barrier on the base substrate, the barrier being formed at least at the concave between at least two of the plurality of lead wires to block the concave; and
  forming the cover layer by spraying a solution for preparing the cover layer on the plurality of lead wires and the barrier.

13. A display panel comprising: the display substrate of claim 1.

14. A display apparatus comprising: the display panel of claim 13.

* * * * *